United States Patent [19]
Taraki

[11] Patent Number: 5,742,276
[45] Date of Patent: Apr. 21, 1998

[54] ENGINE ANALYZER WITH DUAL-TRACE SCOPE AND SELECTIVE CONTROL OF SYNCHRONIZATION OF THE SCOPE TRACES

[75] Inventor: Yosuf M. Taraki, Evanston, Ill.

[73] Assignee: Snap-on Technologies, Inc., Lincolnshire, Ill.

[21] Appl. No.: 631,796

[22] Filed: Apr. 10, 1996

[51] Int. Cl.[6] .............................. G09G 5/36; F02P 17/00
[52] U.S. Cl. .................................... 345/134; 324/379
[58] Field of Search .................................. 345/133, 134, 345/24, 145; 324/378, 379; 364/481, 487; 73/117.3

[56] References Cited

U.S. PATENT DOCUMENTS

| | | | |
|---|---|---|---|
| 4,175,264 | 11/1979 | Schiff | 345/134 |
| 4,399,407 | 8/1983 | Kling et al. | 324/379 |
| 4,476,531 | 10/1984 | Marino et al. | 324/379 |
| 4,891,631 | 1/1990 | Fredlund et al. | 345/145 |
| 4,924,307 | 5/1990 | Landowski et al. | 345/134 |
| 5,039,937 | 8/1991 | Mandt et al. | |
| 5,258,753 | 11/1993 | Jonker et al. | 345/133 |
| 5,296,869 | 3/1994 | Jonker et al. | |
| 5,365,254 | 11/1994 | Kawamoto | 345/134 |
| 5,481,193 | 1/1996 | Mueller et al. | 324/379 |
| 5,517,105 | 5/1996 | Holzwarth | 345/134 |

*Primary Examiner*—Steven Saras
*Assistant Examiner*—David L. Lewis
*Attorney, Agent, or Firm*—Emrich & Dithmar

[57] ABSTRACT

An engine analyzer has a dual-trace display screen, a waveform acquisition means for obtaining analog waveforms from an associated engine and digitizing them, a memory for storing digitized waveform data and a processor for controlling the operation of the memory and the display. The display is operable in live and freeze modes. The displays on the two traces of the display screen are normally synchronized but, in freeze display mode, the user may selectively deactivate the synchronization.

18 Claims, 9 Drawing Sheets

ENGINE ANALYZER WITH DUAL-TRACE SCOPE AND SELECTIVE CONTROL OF SYNCHRONIZATION OF THE SCOPE TRACES

BACKGROUND OF THE INVENTION

1. Field of the Invention

The invention relates to waveform display apparatus in the nature of a digital storage oscilloscope and, in particular, to automotive engine analyzers which utilize such a digital oscilloscope as a display screen.

2. Description of the Prior Art

Digital storage oscilloscopes are well known and typically have two modes of operation, viz., live and freeze. In the live mode, one or more selected input signals are repeatedly sampled by a data acquisition system and the resulting digitized waveform data is displayed on the screen of the oscilloscope and saved in memory. It is known in prior digital engine analyzers to store input waveform data in a memory which is divided into sections. When the freeze mode is activated, data acquisition is suspended and the most recently-displayed frame of data remains "frozen" on the screen. At this point the operator can review previously acquired frames that have been saved in memory by recalling them from memory and displaying them on the screen.

It is known to provide digital oscilloscopes with multiple display traces (e.g., two), so that a number of waveforms can be simultaneously displayed. A dual-trace scope can typically be operated in either single-trace mode or dual-trace mode.

It is also known to provide engine analyzers with display screens which essentially constitute digital oscilloscopes. In the case of a multi-cylinder internal combustion engine, two of the engine waveforms which are commonly displayed on an engine analyzer scope are the primary and secondary ignition voltages which appear, respectively, across the primary and secondary windings of the ignition coil. The primary and secondary waveforms are typically acquired from the engine by means of separate primary and secondary pickup leads. The analyzer also typically has a no. 1 cylinder lead to detect the firing of the no. 1 cylinder so that the analyzer can identify the cylinders once the firing order of the engine is known. Other leads may be utilized to acquire other types of waveforms generated by the engine.

The horizontal scale (also called sweep) of an oscilloscope screen represents time. Broadly speaking, in a digital engine analyzer scope there are two types of sweeps: engine sweeps and fixed-time sweeps. Engine sweeps display a waveform for either a single cylinder ignition or for a complete engine cycle (the time between consecutive firings of the same cylinder), and are typically used to display waveforms related to cylinder ignition events. For engine sweeps, each frame of waveform data stored in memory is divided into N cylinder storage cells, wherein N is the number of cylinders for the engine being tested. Engine sweeps may be of any of three different types: cylinder, parade and raster. In a cylinder sweep, only a single cylinder waveform is displayed. In parade and raster sweeps, all of the cylinders for a complete engine cycle are displayed simultaneously on the screen, the cylinders being displayed in horizontal progression across the width of the screen in a parade sweep and being stacked vertically one atop the other in a raster sweep. Since engine sweeps begin and end with the firing of a cylinder, the time represented by an engine sweep varies with engine speed. Fixed-time sweeps (e.g., 10 ms, 100 ms, etc.) display a fixed period of time across the width of the display screen, and are typically used to display waveforms other than primary and secondary waveforms.

In a dual-trace digital scope, the waveforms in the two traces are normally synchronized with each other. For fixed-time sweeps, synchronization means that, if a vertical line is drawn through both traces, the points at which this line intersects the two waveforms represent the same instant in time. Thus, the two traces contain snapshots of two different waveforms over the exact same time period. For engine sweeps, synchronization means that the waveforms shown in the two traces relate to the same engine cycle. Synchronization of the two traces can be unduly limiting, since it is sometimes desirable to simultaneously view different portions of the same waveform or to examine different engine cycles simultaneously.

SUMMARY OF THE INVENTION

It is a general object of the invention to provide an improved digital oscilloscope and method of operating same which avoid the disadvantages of prior scopes and methods while affording additional structural and operating advantages.

An important feature of the invention is the provision of a multiple-trace digital oscilloscope, wherein the waveforms displayed on the several traces need not be synchronized.

In connection with the foregoing feature, a further feature of the invention is the provision of a digital oscilloscope of the type set forth, which permits user selection of activation and deactivation of the trace synchronization feature.

Yet another feature of the invention is the provision of a method of displaying waveforms respectively on plural traces of an oscilloscope screen without requiring synchronization of the waveforms.

Still another feature of the invention is the provision of a digital engine analyzer incorporating a digital oscilloscope of the type set forth.

Certain features of the invention are attained by providing apparatus for monitoring waveforms from an associated source, the apparatus comprising: waveform acquisition means adapted to be coupled to the associated source for receiving analog input waveforms therefrom and generating digitized waveform data representative of such analog waveforms, memory means for storing digitized waveform data in frames wherein a frame represents waveform data for a particular time period, display means including a display screen for displaying stored waveform data as plural waveform representations respectively on different traces, processing means coupled to the memory means and to the display means and operating under stored program control for controlling storage and display of the waveform data, the processing means including synchronizing means selectively operable between an activated condition wherein the waveform representations displayed on the different traces of the display means are required to be synchronized with one another and a deactivated condition wherein the waveform representations displayed on the different traces of the display means are not required to be synchronized with one another, and switch means selectively operable for activating and deactivating the synchronizing means.

The invention consists of certain novel features and a combination of parts hereinafter fully described, illustrated in the accompanying drawings, and particularly pointed out in the appended claims, it being understood that various changes in the details may be made without departing from the spirit, or sacrificing any of the advantages of the present invention.

BRIEF DESCRIPTION OF THE DRAWINGS

For the purpose of facilitating an understanding of the invention, there is illustrated in the accompanying drawings a preferred embodiment thereof, from an inspection of which, when considered in connection with the following description, the invention, its construction and operation, and many of its advantages should be readily understood and appreciated.

DESCRIPTION OF THE PREFERRED EMBODIMENTS

Figure 1:
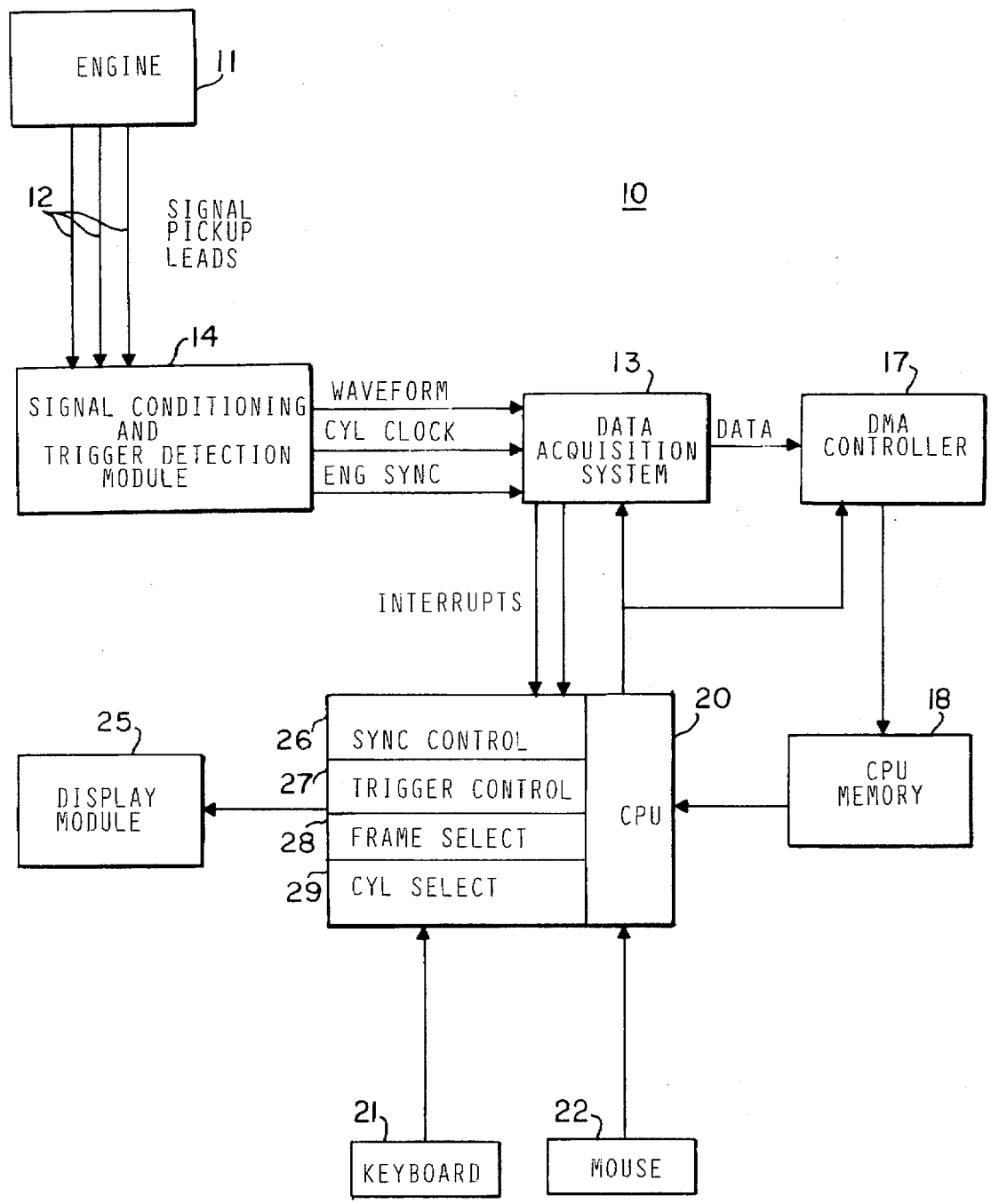
FIG. 1 is a functional block diagram of an engine analyzer system incorporating a digital oscilloscope display in accordance with the present invention.

Referring to FIG. 1, there is illustrated an engine analyzer, generally designated by the numeral 10, in accordance with the present invention. The analyzer 10 is adapted to be coupled to an associated multi-cylinder internal combustion engine 11 for acquiring and analyzing waveform signals generated by the engine 11. For this purpose, the analyzer 10 is provided with a plurality of signal pickup leads 12 adapted to be coupled to selected points in the engine 11 for transferring input analog waveform signals to a waveform data acquisition system 13. While three leads 12 have been shown, simply by way of illustration, it will be appreciated that a larger number of pickup leads could be provided. The waveform data acquisition system 13 may include suitable signal conditioning circuits and trigger detection circuits in a module 14 in a known manner, and also includes an analog-digital converter (ADC) for digitizing the analog input signals to generate digital waveform data in a known manner. The waveform data is applied to a DMA (direct memory access) controller 17 which, in turn, controls the storage of the waveform data in a memory 18.

The analyzer 10 is provided with a suitable central processing unit (CPU) 20, which may be in the form of a microprocessor, which is coupled to the waveform data acquisition system 13, the DMA controller 17 and the memory 18. In particular, the CPU 20 receives interrupts from the waveform data acquisition system 13 and controls the sampling of the analog waveform by the ADC and also controls the operation of the DMA controller 17 for controlling the writing of waveform data to the memory 18. The CPU 20 is preferably provided with a suitable user interface, which may include a keyboard 21 and/or a mouse 22 in a known manner. The analyzer 10 is also provided with a display 25, which is coupled to the CPU 20, and is preferably a color digital oscilloscope which is operable in live and freeze modes and in single-trace and dual-trace modes, with various sweeps and various types of triggering. In use, waveform data read from the memory 18 is passed through the CPU 20 to the display 25.

Input waveform data is managed in units which are herein referred to as "frames", the meaning of which term may depend upon the type of sweep (time scale) selected for the scope display. For engine sweeps, a frame represents input waveform data for a complete engine cycle, even through only a single cylinder may be currently displayed on the screen. For fixed time sweeps, a frame represents waveform data for the period of time corresponding to a single screen width.

In accordance with the present invention, the CPU 20 operates under stored program control and includes modules for performing a number of control functions, including a synchronization control function 26 for controlling synchronization of the traces of the display 25, a trigger control function 27 for the display 25, and a frame selection function 28 and a cylinder selection function 29 for selecting data to be read from the memory 18 for display, as will be explained in greater detail below.

Figure 2:
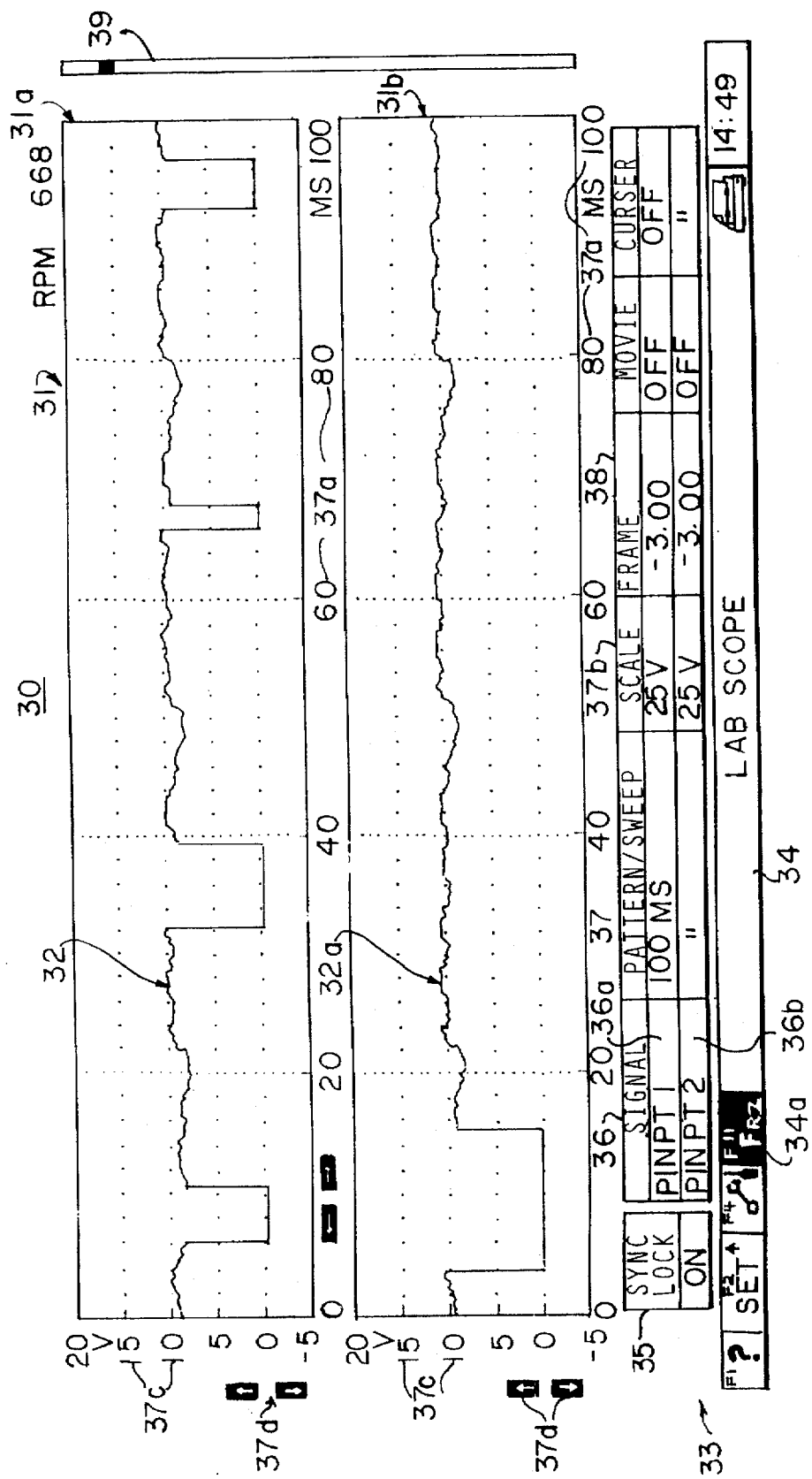
FIGS. 2-5 are screen displays obtainable with the engine analyzer system of FIG. 1.

Referring now to FIG. 2, there is illustrated a screen display 30, which may be displayed on the display 25, when it is in an operational mode for dual-trace display of waveform data. The screen display 30 has a waveform plot area 31 including a first or upper trace section 31a on which a waveform 32 is displayed and a second or lower trace section 31b on which a waveform 32a is displayed. Each of the trace sections 31a and 31b has horizontal and vertical grid lines to facilitate reading coordinate values for different points on the displayed waveform, which grid lines may be selectively turned off. The screen display 30 also depicts current RPM in the upper right-hand corner.

Along the bottom of the screen display 30 is a control panel area 33 including a number of icons and indicators in the form of boxes in which text or other indicia may be displayed and which constitute visual representations of associated switches for selecting various display parameters. At the bottom of the control panel area 33 is a scope mode indicator 34, which indicates the general type of waveform signal being displayed. In FIG. 2 the "Lab Scope" mode has been selected, which is typically used for displaying signals other than primary and secondary ignition signals, which other signals are displayed with a fixed-time sweep. For displaying ignition signals an Ignition Scope mode can be selected (see FIGS. 4 and 5), in which signals are displayed with an engine sweep or a 5 ms engine sweep. There is also provided a Freeze icon 34a which, when highlighted (i.e., displayed with changed colors) as in FIG. 2, selects the Freeze display mode. When this icon is not highlighted the display is in live mode.

A significant aspect of the present invention is that the control panel area 33 includes a Sync Lock icon 35 which has ON and OFF conditions. "Sync" refers to the synchronization of the waveform displays 32 and 32a in the trace sections 31a and 31b. When the Sync Lock is ON, the two waveforms are synchronized and when it is OFF they are not necessarily synchronized, as will be explained more fully below. There is also provided a Signal icon 36, a Pattern/Sweep icon 37, a Scale icon 37b, and a Frame select icon 38, each of which icons includes a pair of vertically aligned boxes, one for each of the trace sections 31a and 31b for separately controlling the parameters for the two traces. A narrow, elongated memory buffer icon 39 extends vertically along the right-hand side of the waveform plot area 31. The length of this icon corresponds to the storage capacity of the memory storage buffers in which frames of waveform data are stored. When the display is the freeze mode, as in FIG. 2, a darkened cursor in the icon 34a indicates the particular frame which is being displayed, with the most recent or zero frame at the top of the icon and the oldest or −Nth frame at the bottom of the icon.

Referring further to FIG. 2, the waveforms 32 and 32a are representations of analog input signals on the Pinpoint leads 1 and 2, respectively. The Pinpoint leads are general-purpose voltage pickup leads among the pickup leads 12, and the signal icon 36 has boxes 36a and 36b which, respectively, indicate that it is those signals which are displayed in the trace sections 31a and 31b. The two boxes of the Pattern/ Sweep icon 37 indicate that a fixed-time 100 ms sweep is being used for each of the trace sections 31a and 31b and, accordingly, it can be seen that for each of these traces the horizontal scale is measured from zero to 100 ms, with time indicia 37a being displayed in 20 ms increments. The scale icon 37b indicates that a 25-volt scale has been selected for each of the trace sections 31a and 31b and, accordingly, scale indicia 37c are arranged along the vertical axis for each trace section in 5-volt increments, from −5 volts to +20 volts. The zero-volt level can be repositioned along the vertical axis of each trace section by activating the arrow icons 37d by means of the keyboard 21 or the mouse 22 in a known manner.

The two boxes of the Frame Select icon 38 indicate that both trace sections are displaying the same frame data, i.e., frame −3. In this regard, it is noted that waveform data are stored in a circular array of storage buffers in the memory 18, with one frame per buffer. For cylinder sweeps, each buffer is divided into N cylinder storage cells, where N is the number of cylinders for the engine being tested. For fixed-time sweeps, as in FIG. 2, a frame represents the waveform for a period of time corresponding to a single screen width, i.e., 100 ms in this case. When freeze mode is activated, integer frame numbers are assigned to all saved data frames. Zero is assigned to the most recently displayed frame, preceding frames being assigned incrementally larger negative numbers. In this case, the fact that the same frame has been selected for both trace sections 31a and 31b means that the traces are, respectively, displaying the signals appearing at the first and second Pinpoint leads during the same 100 ms time period.

In FIG. 2 the Freeze switch indicium 34a is highlighted, indicating that the freeze display mode is selected, so that each of the waveforms 32 and 32a is a frozen display of the waveform data stored in the −3 frame buffer of the memory 18. Also, the Sync Lock switch indicium 35 is in the ON condition, indicating that the waveforms 32 and 32a are synchronized, i.e., for the fixed-time sweep illustrated, vertical lines through the waveforms 32 and 32a represent the same instant in time.

In the present invention, in live display mode, the two traces 31 and 33 are always synchronized. In the freeze display mode, the synchronization is ON by default but, in accordance with the present invention, it can be turned OFF via the Sync Lock switch 35. Thus, with synchronization turned off, the operator can review captured data in trace sections 31a and 31b independently, enabling simultaneous viewing of data from two different frames. When Sync Lock 35 is ON, the frame switches of the frame icon 38 for the two traces are tied together, so that changing the frame setting for either trace will automatically change the other trace accordingly. Thus, in FIG. 2, the frame icon 38 shows both traces with the −3.00 frame. In accordance with the present invention, when the Sync Lock 35 is OFF, the frame icon 38 can be operated independently for the two traces.

Figure 3:
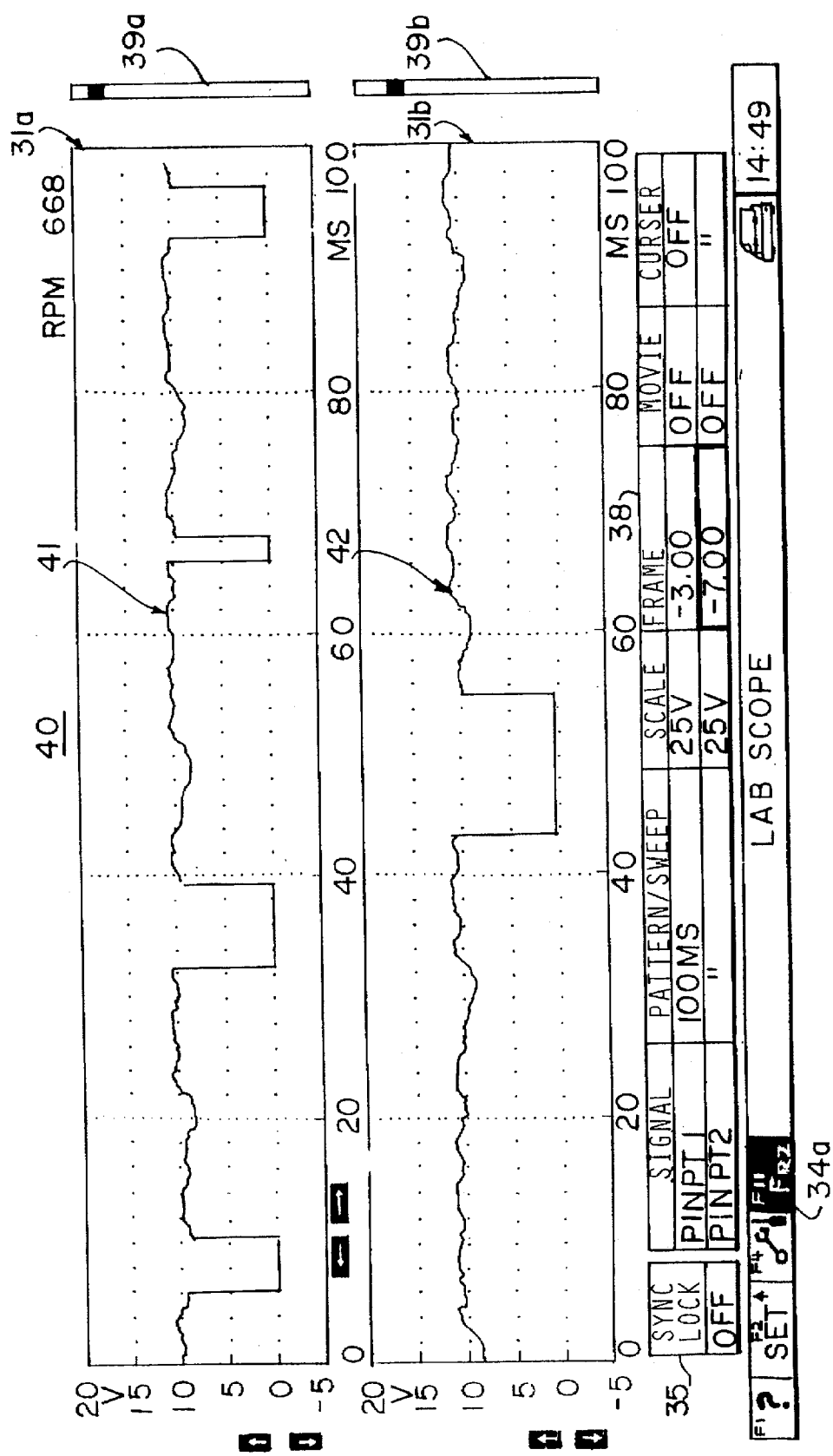

Referring now to FIG. 3, there is illustrated a screen display 40 with waveforms 41 and 42, respectively, displayed on the two traces. The screen display 40 is similar to the screen display 30 of FIG. 2, except that in this case the Sync Lock switch 35 is OFF, so that the waveforms 41 and 42 are not synchronized. Thus, in this case while waveform 41 is still frame −3, waveform 42 is now frame −7, as is indicated in the Frame select icon 38. Since different frames are shown on the two traces, the memory buffer icon has been split into two sections 39a and 39b.

Figure 4:
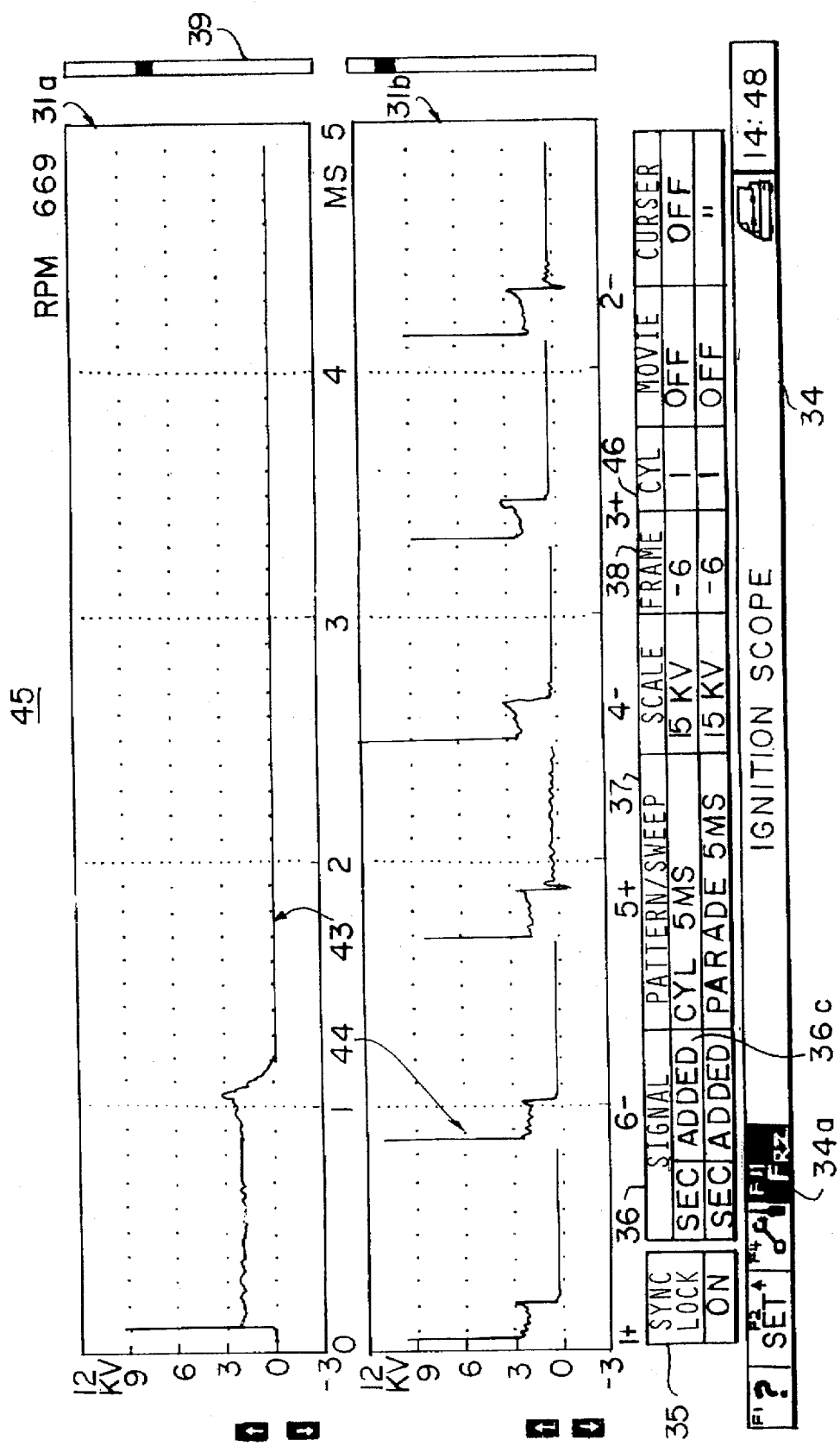

Referring now to FIG. 4, there is illustrated a screen display 45, in which the trace sections 31a and 31b, respectively, display waveforms 43 and 44. In this case, the scope mode icon 34 is in the Ignition Scope mode, since the displayed waveforms 43 and 44 are ignition waveforms. More specifically, the boxes of the signal icon 36 indicate that the displayed waveforms are from the secondary input lead. In this case there are additional signal icon boxes 36c because the engine under test has a distributorless ignition system (DIS). In DIS systems the secondary signal switch selection can have any of three display conditions, viz., "Added", "Power" and "Wasted", the selected mode being indicated in the icon boxes 36c. In this case, the "Added" mode is selected.

The Sync Lock icon 35 is ON, so that the same frame (frame −6) is displayed in both traces, as indicated by the frame select icon 38. In the screen display 45, 5 ms engine sweeps are selected. The 5 ms engine sweeps are similar to the standard engine sweeps, discussed above, except that only the first 5 ms of each cylinder is plotted. There are three types of 5 ms engine sweeps, viz., cylinder 5 ms., parade 5 ms and raster 5 ms. In this case, a cylinder 5 ms sweep is selected for trace section 31a, while a parade 5 ms sweep is selected for trace section 31b. Note that this is possible, even though the Sync Lock 35 is ON, since for engine sweeps, synchronization of the displayed waveforms means that waveform data from the same engine cycle is displayed on each trace. Thus, all 6 cylinders of frame −6 are displayed in parade in trace section 31b, while only cylinder 1 of frame −6 is displayed in trace section 31a. In each case only the first 5 ms of each cylinder is displayed and the cylinder numbers are indicated beneath trace section 31b, with the cylinders being displayed in the actual firing order of the engine. The "+" and "−" indications next to the cylinder numbers are used only for DIS ignitions and indicate the polarity of the spark on the power stroke for the cylinder.

Since the Ignition Scope mode has been selected in FIG. 4, the control panel area 33 includes an additional cylinder icon 46 to indicate the particular cylinder selected. In the box for the first trace the cylinder icon 46 displays the number 1, indicating the particular cylinder of frame −6 which is being displayed in the first trace. Note that the number 1 also appears in the second trace box of the Cylinder icon 46. In this case, the cylinder number does not indicate the cylinder displayed, since all cylinders in the frame are displayed in parade. Rather, the cylinder number indicates the starting cylinder in the display, i.e., the cylinder in which the display is triggered, which is fixed.

Figure 5:
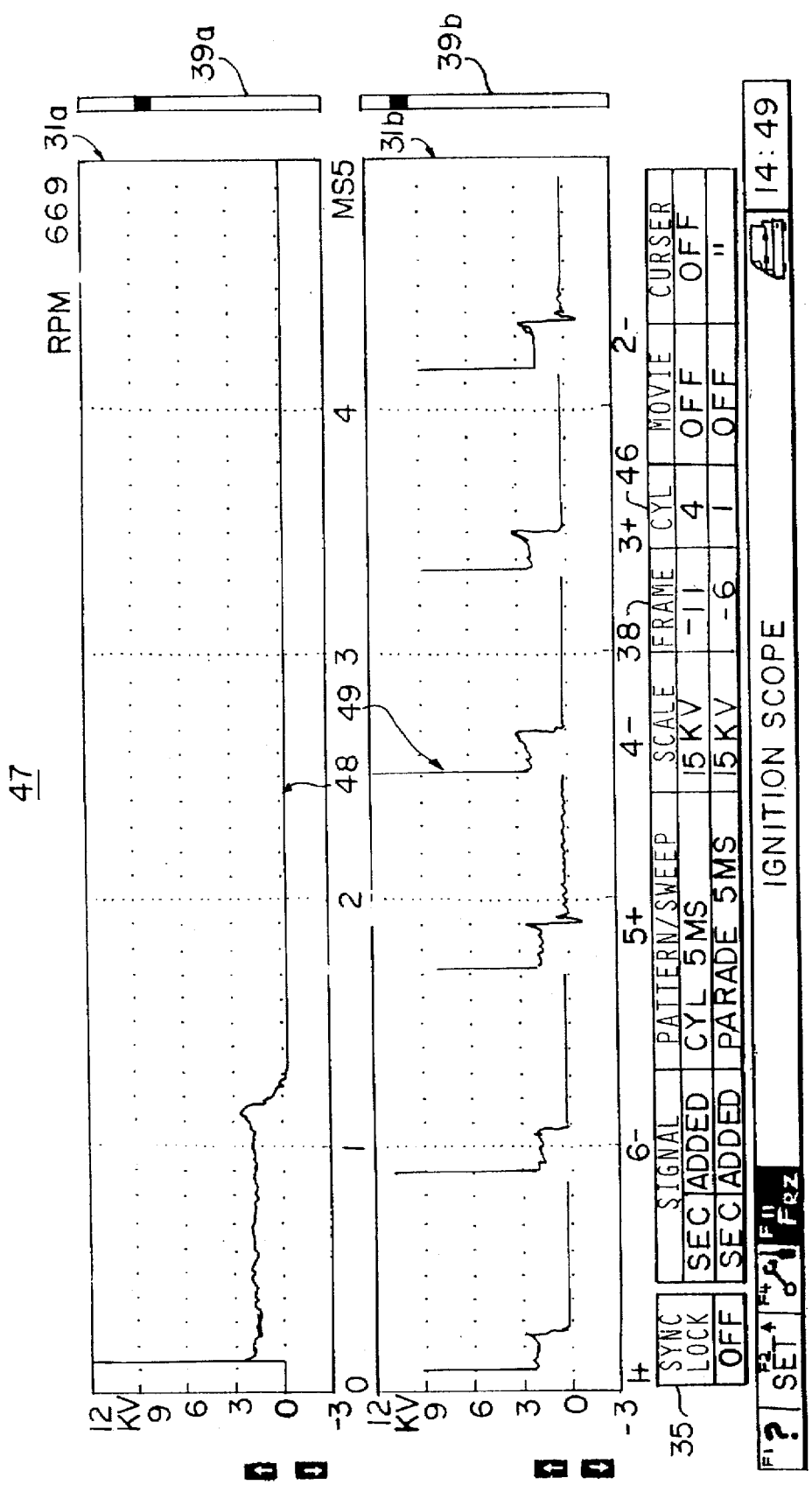

Referring to FIG. 5, there is illustrated a screen display 47 which is similar to the screen display 45 of FIG. 4, except that in this case the Sync Lock switch 35 is OFF. Thus, the displays on trace sections 31a and 31b do not have to be from the same frame. Indeed, in this case the waveform 48 displayed in trace section 31a is from frame −11, whereas the waveform 49 on trace section 31b is of frame −6, as indicated by the Frame select icon 38. Note also that, in this case, the fourth cylinder is displayed in trace section 31a, as indicated by the Cylinder select icon 46. As was the case in FIG. 3, because the Sync Lock switch 35 is OFF, separate memory buffer icons 39a and 39b are shown for the two traces.

As can be seen in FIGS. 2–5, the screen displays include other icons, indicators and other types of indicia which are not described, since they are not pertinent to the present invention.

Figure 6:
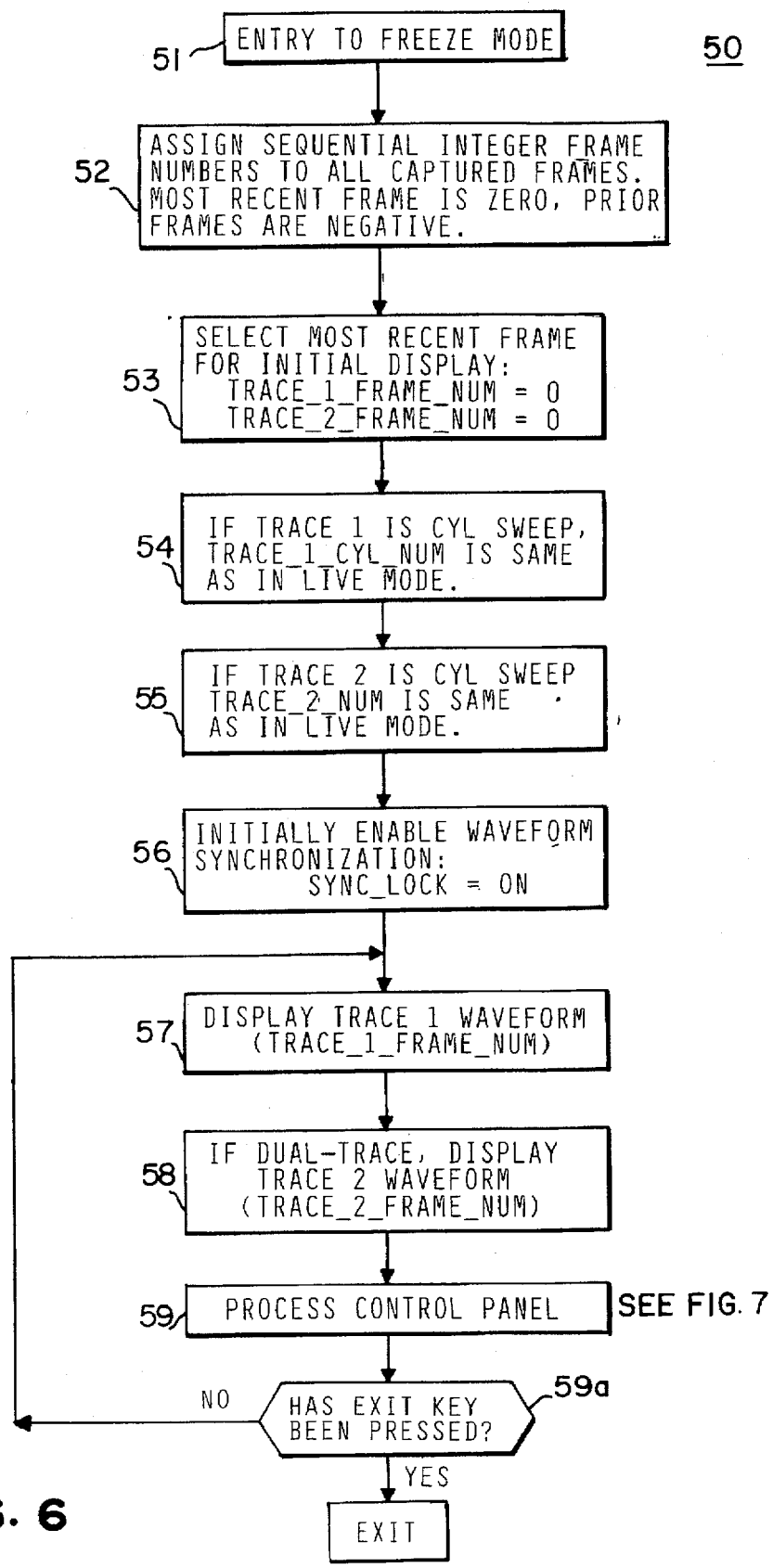
FIG. 6 is a flow chart diagram of a software program of the engine analyzer of FIG. 1 for entering the freeze display mode.

Referring now to FIGS. 6–9, the operation of the analyzer 10 in connection with selection of certain display parameters of the screen displays of FIGS. 2–5 will now be described. In FIG. 6, there is illustrated a flow diagram 50 for the program routine for entry into the freeze mode. When the operator desires to select the freeze display mode, he highlights the Freeze icon 34a by using the F11 function key on the keyboard 21 or by clicking on the Freeze icon 34a with the mouse 22. As was indicated above, when the freeze mode is selected the Freeze icon 34a is highlighted, as indicated in FIG. 2, and the program enters the freeze mode at 51 (FIG. 6). Then, at 52, the program assigns sequential integer frame numbers to all captured frames in the memory 18, with the most recently displayed frame being numbered zero and with preceding frames being assigned incrementally larger negative numbers. Then, at 53, the program selects the most recent frame (i.e., frame 0) for initial display. Thus, initially, the Frame select icon 38 will display the number 0 for each of the first and second traces of the display. Next, at 54 and 55 the program checks to see if either of the first and second traces has a cylinder sweep selected and, if so, the cylinder number displayed on that trace is the cylinder number which had been selected in the live mode. Thus, for example, referring to FIG. 4, the fact that the Cylinder select icon 46 displays the number "1" for the first trace indicates that, when the freeze mode was entered, a live display of cylinder 1 was being displayed on the first trace.

Figure 7:
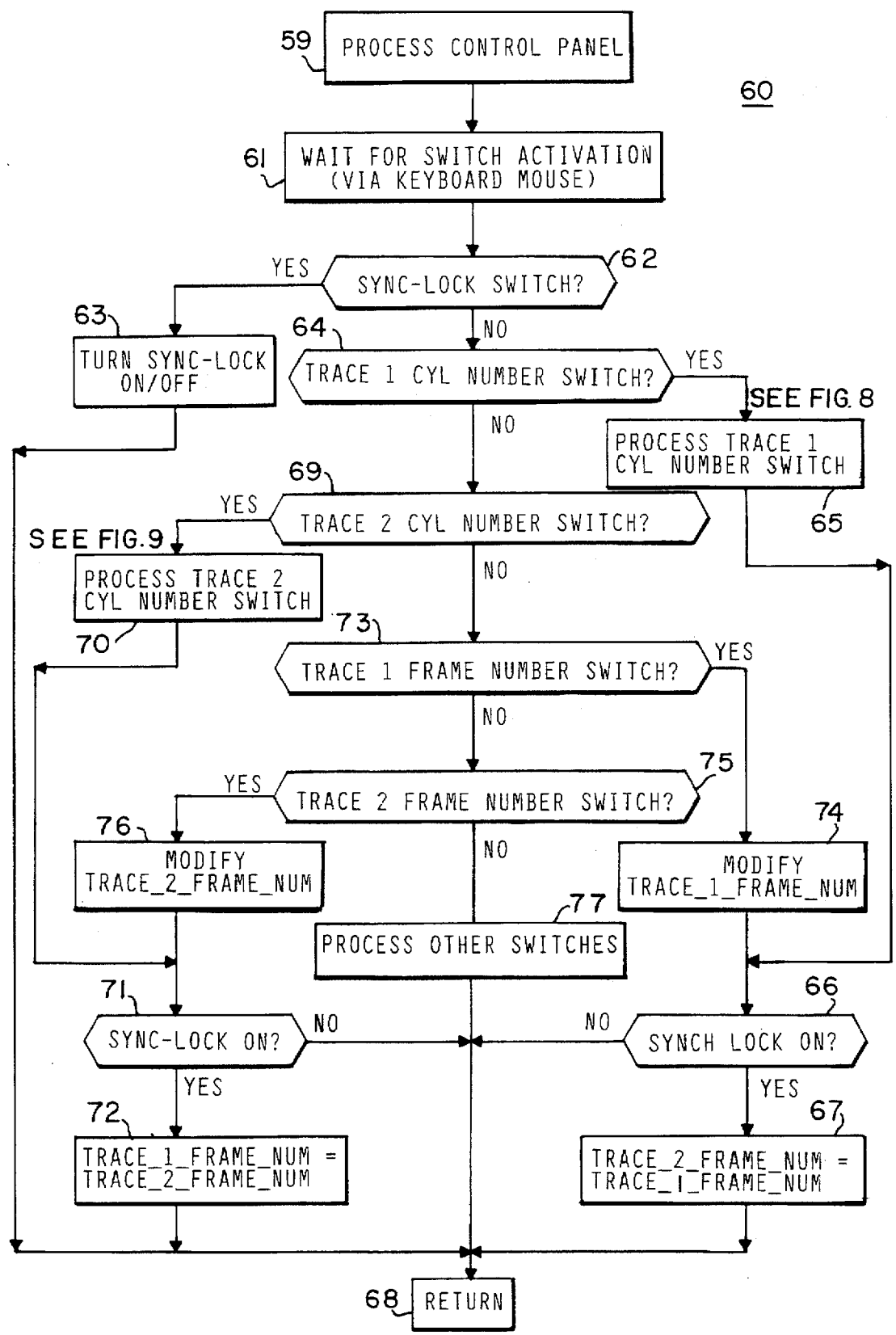
FIG. 7 is a flow chart diagram of a process control subroutine of the program of FIG. 6.

Next, at 56, the program initially enables the waveform synchronization, switching the Sync Lock icon 35 to ON, which is its default condition. Then, at 57, the program displays the first trace waveform. (This would be the only waveform displayed if the display 25 were operating in a single-trace mode.) If the display is operating in a dual-trace mode, the program at 58 displays the second trace waveform. Then, at 59, the program enters a process control panel subroutine, the details of which are illustrated in FIG. 7 to be described below, to determine if any of the switches corresponding to icons 35–38 and 46 have been activated. The program then checks at 59a to see if the EXIT key has been pressed on the keyboard 21. If it has not, the program returns to block 57, to repeat the display of the appropriate waveforms, depending upon the condition of the process control switches, and then rechecks the process control panel switches. If the EXIT key has been pressed at 59a, the program routine 50 is exited.

Referring now to FIG. 7, there is illustrated a subroutine 60 for the process control panel, which was entered at 59 from the freeze mode routine 50 of FIG. 6. At 61, the program awaits a switch activation, which can be effected by the use of the keyboard 21 or the mouse 22. More specifically, in order to activate a switch corresponding to one of the icons 35–38 and 36 with the keyboard 21, the operator uses the arrow keys on the keyboard 21. Each key depression will index the activation from the currently activated icon one icon in the direction of the arrow, activation being indicated by emphasis of the activated icon on the screen. Alternatively, by use of the mouse, the user places the mouse cursor in the icon box to be emphasized and clicks the left mouse button. Emphasis is indicated in the drawings (and on the screen) by a heavier outline around the icon box (see boxes for frame icon 38 in FIGS. 2–4 and for cylinder icon 46 in FIG. 5). Once an icon box has been emphasized, the value of the indicium displayed in that icon can be indexed forwardly or rearwardly by use of the "+" and "−" keys on the keyboard 21 or, alternatively, by scrolling with the mouse 22. In the latter technique, the mouse cursor is placed within the emphasized box and the mouse button is held down to enter a scroll mode, in which the box icon goes to reverse video and the cursor is trapped within the box. Then, with the switch depressed, the mouse is dragged up or down to increment or decrement the values within the box. In addition to incrementing and decrementing the switches, a new cylinder number can be selected for the Cylinder select icon 46 by use of the keyboard 21 by simply pressing the appropriate numbered key, in which case the icon value jumps immediately to the selected cylinder without indexing through intermediate cylinders. (Note that a different technique is used for operating the switch for the Freeze icon 34a, as was explained above.)

When a switch activation is detected, the program checks at 62 to see if it is the switch for the Sync-Lock icon 35. If so, the program toggles the Sync-Lock switch 35 at 63 to its opposite condition and then returns to the freeze routine 50 at 68. If the switch was not the Sync-Lock switch 35, the program next checks at 64 to see if it is the Cylinder select switch 46 for the first trace. If so, the program moves at 65 to a subroutine for processing the first trace Cylinder select switch 46, which will be explained more fully below in connection with FIG. 8. The program then checks at 66 to see of the Sync-Lock switch 35 is ON. If not, the program returns at 68 to the freeze routine 50, and if the switch 35 is ON, the program at 67 sets the frame number for the second trace to be the same as that for the first trace, i.e., it synchronizes the traces. The program then returns at 68 to the routine 50, reentering it at 59a (FIG. 6).

If, at 64, the Cylinder select switch 46 for the first trace was not activated, the program checks at 69 to see if the Cylinder select switch 46 for the second trace was activated. If so, the program executes a subroutine at 70 to process this switch selection, as will be explained in greater detail in connection with FIG. 9, and then checks at 71 to see if the Sync-Lock switch 35 is ON. If not, the program returns at 68 and if so, the traces are again synchronized at 72 by making the frame number for the first trace equal to that of the second.

If, at 69, the Cylinder select switch 46 for the second trace was not activated, the program next checks at 73 to see if the Frame select switch 38 for the first trace was actuated. If so, the program at 74 modifies the first trace frame number accordingly, and then proceeds through decision 66 and block 67, as described above. If the Frame select switch 38 for trace 1 has not been activated, the program checks at 75 to see if the Frame select switch 38 for trace 2 was activated. If so, the program at 76 modifies the second trace frame number accordingly and then proceeds through the decision 71 and block 72, as described above. If the decision at 75 was negative, the program then proceeds at 77 to process the other switches and then returns at 68.

Figure 8:
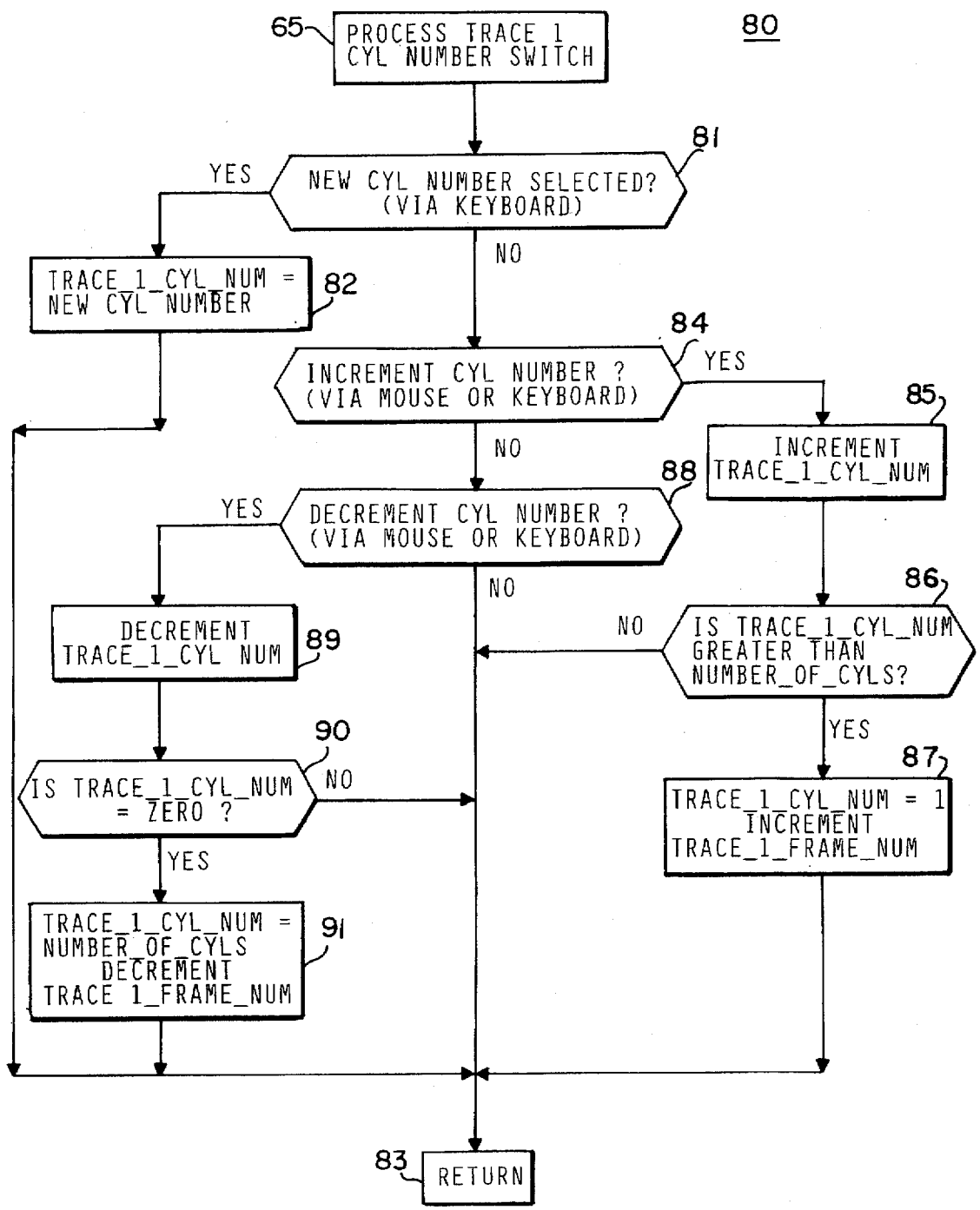
FIGS. 8 and 9 are flow chart diagrams of subroutines of the software routine of FIG. 7.

Referring to FIG. 8, there is illustrated a subroutine 80 for processing the Cylinder select switch for trace 1. The subroutine is entered at 65 from the process control panel subroutine 60, as described above in connection with block 65 of FIG. 7, and checks at 81 to see if a new cylinder number has been selected by use of a number key of the keyboard 21. If so, the program at 82 makes the first trace number equal to the selected number and then returns at 83 to the process control panel subroutine 60 of FIG. 7 at decision 66. If a new cylinder number was not selected by a number key on the keyboard, the program next checks at 84 to see if the cylinder number was incremented by use of the mouse or keyboard. If so, the program increments the first trace cylinder number accordingly at 85, and then checks at 86 to see if the first trace cylinder number is greater than the number of cylinders in the engine under test. If not, the program returns at 83 to the routine 60 of FIG. 7 at decision 66. If the first trace cylinder number is greater than the number of cylinders in the engine, the program at 87 increments the first trace frame number and switches the first trace cylinder number to 1. Thus, when the cylinder number is incremented past the highest number cylinder in the engine, the program wraps to the first cylinder of the next frame. If, at 84, the cylinder number had not been incremented, the program checks at 88 to see if it had been decremented by the mouse or keyboard. If not, the program returns at 83 and, if so, the program decrements the first trace cylinder number accordingly at 89. It then checks at 90 to see if the first trace cylinder number is equal to zero, i.e., is less than cylinder no. 1, and, if not, returns at 83 and, if so, wraps at 91 to the highest cylinder number of the preceding frame, and then returns.

Figure 9:
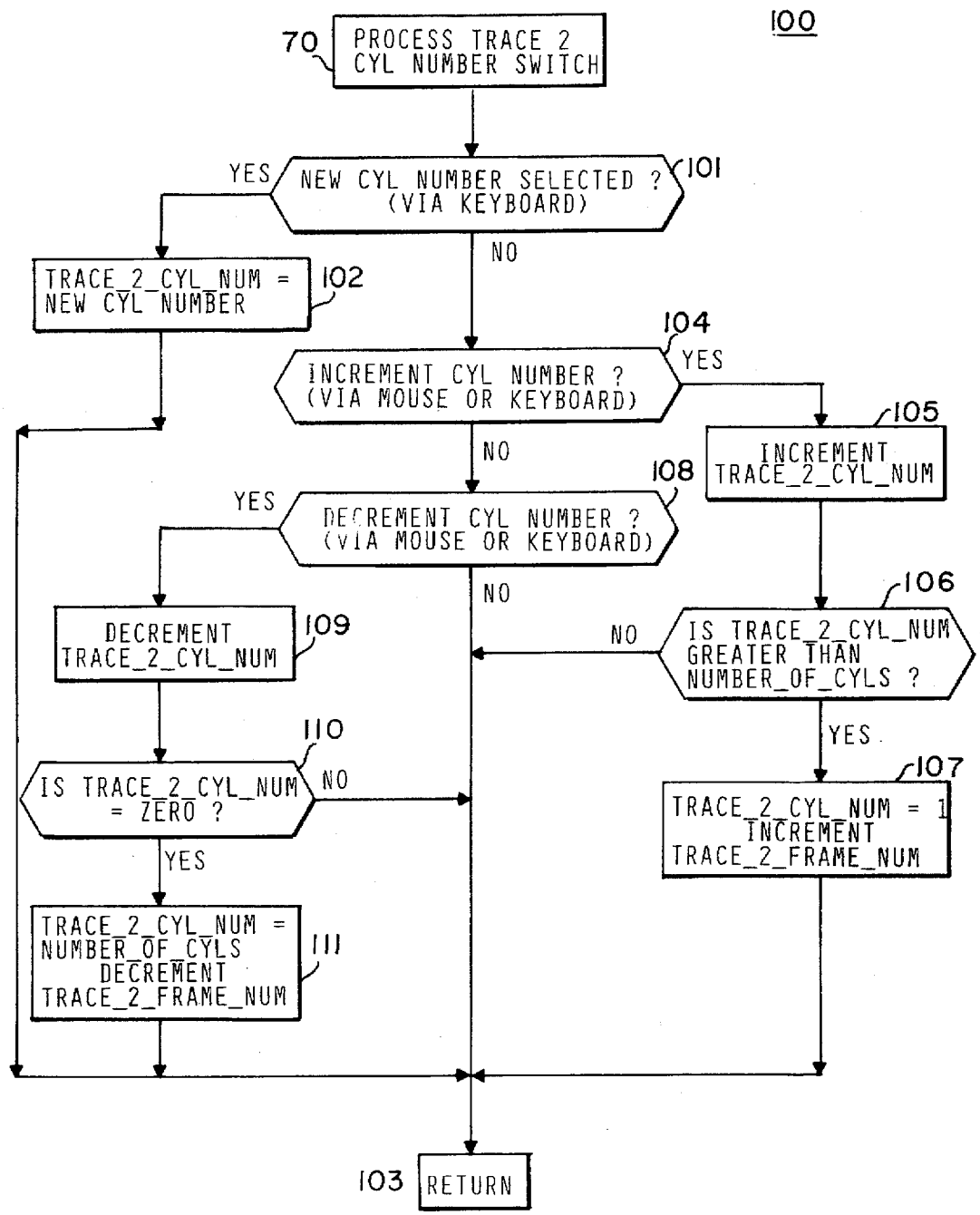

Referring to FIG. 9, there is illustrated a subroutine 100 for processing the activation of the Cylinder select switch 46 for trace 2, which subroutine is entered at 70 of the process control panel subroutine 60 of FIG. 7. The subroutine 100 is essentially the same as the subroutine 80 described above in connection with FIG. 8. Thus, the routine checks at 101 to see if a new cylinder number was selected with a number key and, if so, changes the second trace cylinder number to the selected number and then returns at 103 to the subroutine 60 of FIG. 7 at decision 71. If a cylinder was not selected with a number key, the program checks at 104 to see if it was incremented by the mouse or keyboard and, if so, performs the increment function at 105, then checks at 106 to see if it is incremented past the highest cylinder number and, if so, wraps to the next frame at 107. If the cylinder number had not been incremented, the program checks at 108 to see if was decremented and, if so, performs the appropriate decrement function at 109 and then checks to see if it is decremented past the lowest cylinder number at 110 and, if so, wraps to the preceding frame at 111 before returning.

From the foregoing, it can be seen that there has been provided an improved engine analyzer with a dual-trace display, wherein the synchronization of the two display traces can be disabled to permit, inter alia, display of different frames on the two traces.

While particular embodiments of the present invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

I claim:

1. Apparatus for monitoring waveforms from an associated source, said apparatus comprising:

waveform acquisition means adapted to be coupled to the associated source for receiving analog input waveforms therefrom and generating digitized waveform data representative of such analog waveforms, memory means for storing digitized waveform data by frames wherein a frame represents waveform data for a particular time period, display means including a display screen for displaying stored waveform data as plural waveform representations respectively on different traces, processing means coupled to said memory means and to said display means and operating under stored program control for controlling storage and display of the waveform data, said processing means including synchronizing means selectively operable between an activated condition wherein the waveform representations displayed on the different traces of the display means are required to be synchronized with one another and a deactivated condition wherein no waveform representation displayed on any trace of the display means is required to be synchronized with the waveform representation displayed on any other trace of the display means, and switch means selectively operable for activating and deactivating said synchronizing means as to simultaneously displayed waveform representations.

2. The apparatus of claim 1, wherein said switch means includes an icon on the display screen and manually-operable user interface means for controlling the condition of the icon.

3. The apparatus of claim 2, wherein said interface means includes a keyboard.

4. The apparatus of claim 2, wherein said interface means includes a mouse.

5. The apparatus of claim 1, and further comprising sweep control means for selecting from among several sweep period formats for the display means.

6. The apparatus of claim 1, and further comprising freeze control means for selecting between a live display mode wherein waveform data is displayed substantially as it is generated and a freeze display mode wherein data generation is terminated and previously generated waveform data is displayed.

7. The apparatus of claim 6, and further comprising means operable in the freeze display mode for selecting the displayed waveform data from waveform data stored in the memory means.

8. The apparatus of claim 6, wherein said processing means includes means for preventing switching of said synchronizing means to the deactivated condition in the live display mode and for permitting switching of said synchronizing means to the deactivated condition in the freeze display mode.

9. Apparatus for monitoring waveforms of a multi-cylinder internal combustion engine having an engine cycle which is the time between two consecutive firings of the same cylinder, said apparatus comprising:

waveform acquisition means adapted to be coupled to an associated internal combustion engine for receiving analog input waveforms therefrom and generating digitized waveform data representative of such analog waveforms, memory means for storing digitized waveform data in frames wherein a frame represents waveform data for a particular time period, display means including a display screen for displaying stored waveform data as plural waveform representations respectively on different traces, processing means coupled to said memory means and to said display means and operating under stored program control for controlling storage and display of the waveform data, said processing means including synchronizing means selectively operable between an activated condition wherein the waveform representations displayed on the different traces of the display means are required to be synchronized with one another and a deactivated condition wherein no waveform representation displayed on any trace of the display means is required to be synchronized with the waveform representation displayed on any other trace of the display means, and switch means selectively operable for activating and deactivating said synchronizing means as to simultaneously displayed waveform representations.

10. The apparatus of claim 9, and further comprising sweep control means for selecting among fixed-time sweeps and engine sweeps, wherein a frame represents waveform data for the width of the display screen when a fixed-time sweep is selected and represents waveform data for a complete engine cycle when an engine sweep is selected.

11. The apparatus of claim 9, and further comprising freeze control means for selecting between a live display mode wherein waveform data is displayed substantially as it is generated and a freeze display mode wherein data generation is terminated and previously generated waveform data is displayed.

12. The apparatus of claim 11, wherein said processing means includes means for preventing switching of said synchronizing means to the deactivated condition in the live display mode and for permitting switching of said synchronizing means to the deactivated condition in the freeze display mode.

13. The apparatus of claim 9, wherein said processing means includes means controlling said memory means so that each frame is divided into a plurality of cylinder cells when an engine sweep is selected, and further comprising means for selecting a particular cylinder for display.

14. The apparatus of claim 13, wherein said means for selecting a cylinder includes means for independently selecting a cylinder to be displayed on each trace of the display means.

15. The apparatus of claim 9, and further comprising means operable in the freeze display mode for selecting a frame stored in said memory means to be displayed on said display means.

16. The apparatus of claim 15, wherein said means for selecting a frame includes means for independently selecting the frame displayed on each trace of said display means.

17. A method for monitoring analog input waveforms from a multi-cylinder internal combustion engine having an engine cycle which is the time between two consecutive firings of the same cylinder, said method comprising the steps of:

digitizing the analog input waveforms for generating digitized waveform data representative of such analog waveforms, storing the digitized waveform data by frames wherein a frame represents waveform data for a particular time period, displaying the stored waveform data as plural waveform representations respectively on different traces of a display screen such that no waveform representation displayed on any trace is synchronized with the waveform representation simultaneously displayed on any other trace of the display means, and freezing the waveform representations displayed on the different traces.

18. The method of claim 17, wherein the waveform representations are displayed on the display screen with any of several fixed-time sweeps and engine sweeps, and wherein a frame represents waveform data for the width of the display screen when a fixed-time sweep is used and represents waveform data for a complete engine cycle when an engine sweep is used.

* * * * *